United States Patent
Moriguchi et al.

[11] Patent Number: 6,088,821
[45] Date of Patent: Jul. 11, 2000

[54] LOGIC CIRCUIT VERIFICATION DEVICE FOR SEMICONDUCTOR INTEGRATED CIRCUIT

[75] Inventors: Yasuo Moriguchi; Hiroyuki Mori; Yoshio Inoue; Toshinori Inoshita, all of Tokyo, Japan

[73] Assignee: Mitsubishi Denki Kabushiki Kaisha, Tokyo, Japan

[21] Appl. No.: 09/041,798

[22] Filed: Mar. 13, 1998

[30] Foreign Application Priority Data

Sep. 9, 1997 [JP] Japan .................................. 9-244384

[51] Int. Cl.$^7$ .......................... G01R 31/28; G06F 11/00; G06F 13/00
[52] U.S. Cl. .................... 714/724; 714/741; 395/500.35; 395/500.36
[58] Field of Search ............................ 714/33, 724, 735, 714/736, 741, 742, 744; 395/500.01–500.36

[56] References Cited

U.S. PATENT DOCUMENTS

| | | | |
|---|---|---|---|
| 4,922,445 | 5/1990 | Mizoue et al. ...................... | 395/500.36 |
| 5,345,401 | 9/1994 | Tani .................................... | 395/500.37 |
| 5,603,015 | 2/1997 | Kurosawa et al. .................. | 395/500.36 |
| 5,650,938 | 7/1997 | Bootehsaz ........................... | 395/500.07 |
| 5,689,683 | 11/1997 | Takasaki et al. .................... | 395/500.36 |
| 5,841,967 | 11/1998 | Sample et al. ............................ | 714/33 |

FOREIGN PATENT DOCUMENTS

| | | |
|---|---|---|
| 6-215063 | 8/1994 | Japan . |
| 6-259501 | 9/1994 | Japan . |
| 8-153126 | 6/1996 | Japan . |

*Primary Examiner*—Emmanuel L. Moise
*Attorney, Agent, or Firm*—McDermott, Will & Emery

[57] ABSTRACT

A logic verification apparatus for a semiconductor integrated circuit classifies a program described in HDL into connection information of a synchronous circuit portion and connection information of a asynchronous circuit portion, converts a portion of the connection information of the asynchronous circuit portion into the connection information of the synchronous circuit portion and increases circuit portions the function of which can be verified by a cycle based simulation/static timing verification unit, thus making it possible to shorten the time for verification.

6 Claims, 9 Drawing Sheets

FIG. 2

PROGRAM CONCERNING LOGIC CIRCUIT A0:

```
module A1(CLK1,DATA1,~);
input CLK1,DATA1,~;
always @(posedge CLK1) begin         ASL1
    reg1<=DATA1;
    logic1<=reg1+α;
    reg2<=logic1;
    ...
end
endmodule module A2(CLK1,DATA2,~);
input CLK1,DATA2,~;
always @(posedge CLK1) begin         ASL2
    reg3<=DATA2;
    ...
end
endmodule module A0(CLK1,DATA1,~);
input CLK1,DATA1,~;
I1 A1(CLK1,DATA1,~);
I2 A2(CLK1,DATA2,~);
endmodule
```

PROGRAM CONCERNING LOGIC CIRCUIT B0:

```
module B0(CLK2,CLK3,DATA3,DATA4
        ,G_CLK1,G_CLK2);
input CLK2,CLK3,DATA3,DATA4;
output G_CLK1,G_CLK2;
J1 B1(CLK2,CLK3,DATA3,DATA4
        ,G_CLK1,G_CLK2);
J2 B2(G_CLK1,~);
J3 B2(G_CLK2,~);
endmodule module B1(CLK2,CLK3,DATA3,DATA4
        ,G_CLK1,G_CLK2);
input CLK2,CLK3,DATA3,DATA4;
output G_CLK1,G_CLK2;
always @(posedge CLK2) begin         BSL1
    G_CLK1<=DATA3;
    ...
end
always @(posedge CLK3) begin
    reg4<=DATA4;
    G_CLK2<=reg4+DATA5;
end
endmodule module B2(G_CLK1,~);
input G_CLK1,~;
always @(posedge G_CLK1) begin       BSL2
    ...
end
endmodule module B3(G_CLK2,~);
input G_CLK2,~;
always @(posedge G_CLK2) begin       BSL3
    ...
end
endmodule
```

DRIVER : A→Y=0.2 n s
AND : A→Y=0.4 n s
       B→Y=0.4 n s
OR   : A→Y=0.5 n s
       B→Y=0.5 n s

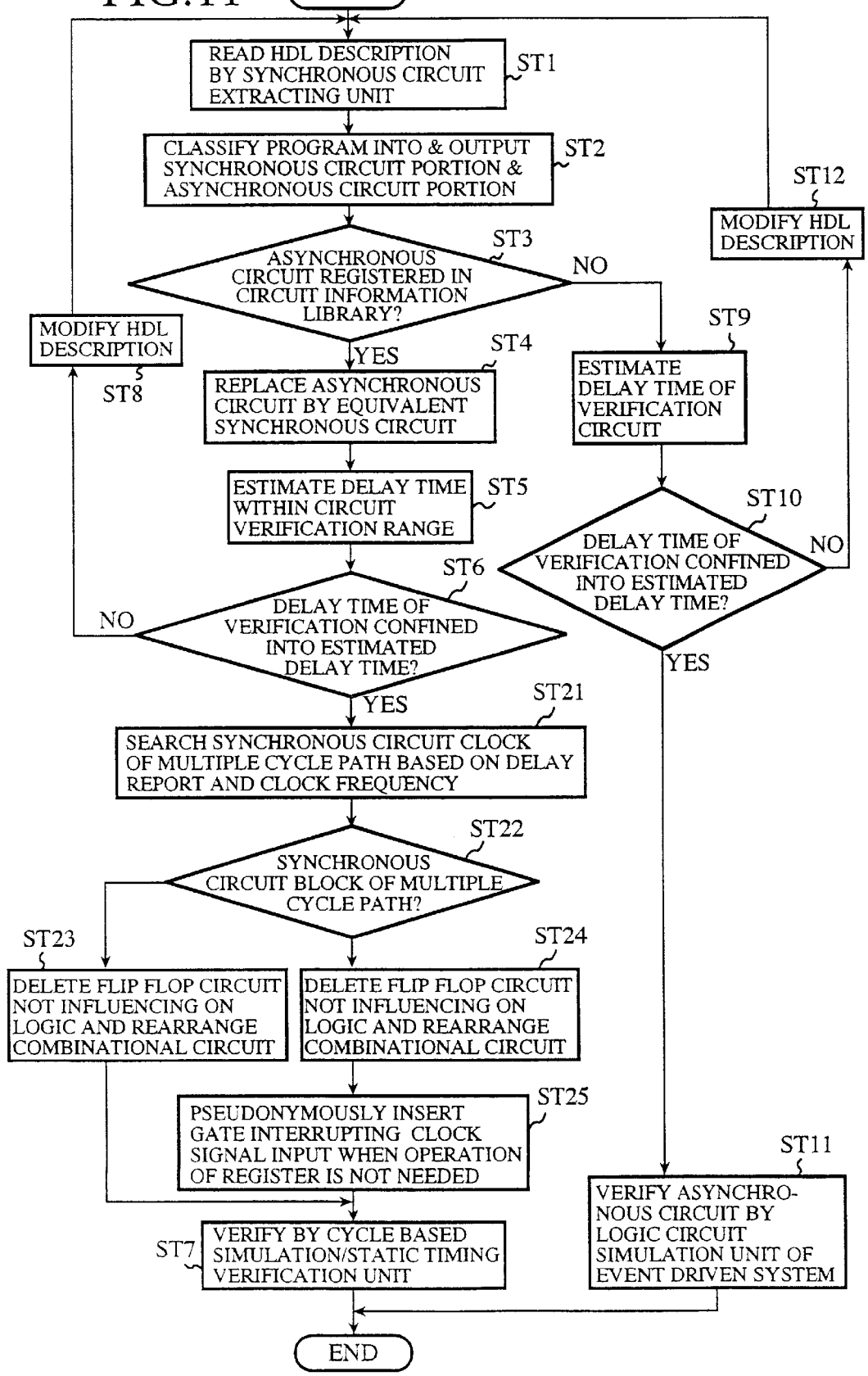

LOGIC CIRCUIT VERIFICATION DEVICE FOR SEMICONDUCTOR INTEGRATED CIRCUIT

BACKGROUND OF THE INVENTION

1. Field of the Invention

The present invention relates to a logic circuit verification device for a semiconductor integrated circuit for verifying a logic circuit of a semiconductor integrated circuit such as an LSI (Large Scale Integrated) circuit, which is described on a computer by using hardware description language (hereinafter referred to as "HDL"), in conformity with a cycle based simulation method, a static timing verification method, a logic circuit simulation method based on an event-driven system or the like.

2. Description of the Prior Art

According to a conventional logic circuit verification device for a semiconductor integrated circuit, a logic circuit is verified by using a cycle based simulation/static timing verification method based on cycle based simulation or static timing verification, or the logic circuit simulation method based on the event-driven system.

According to the cycle based simulation/static timing verification method, the verification of a logic circuit is done by checking the operation of sending and receiving signals among circuit elements constituting a semiconductor integrated circuit, for example flip-flop circuits, on the occurrence of changing of an event of a clock that constitutes a trigger for causing state change; and then by analyzing delay time and operational timing of a memory element, such as a register (a flip-flop circuit or a latch circuit), a combinational circuit or the like.

Further, according to the logic circuit simulation based on the event-driven system, the verification of a logic circuit is done by reproducing a total operation of an actual circuit after inputting delay time, operational timing and functions of a register, a combination circuit or the like into the logic circuit verification device.

Although high speed verification of a logic circuit can be achieved in the cycle based simulation/static timing verification method compared with the logic circuit simulation based on the event-driven system, the verification of a logic circuit can be carried out only in respect of a synchronous circuit block including a combinational circuit portion where a signal is transmitted in 1 cycle or less of a clock pulse in the combinational circuit portion connected between registers (hereinafter, referred to as "single cycle path"). In respect of a synchronous circuit block including a combinational circuit portion where 2 cycles or more of clock pulses are needed in transmitting a signal between registers interposing the combinational circuit (hereinafter, referred to as "multiple cycle path"), the verification had to be carried out by using the logic circuit simulation based on the event-driven system.

The conventional logic circuit verification device for a semiconductor integrated circuit is constituted as described above. This, when there are many asynchronous circuit portions or synchronous circuit blocks of multiple cycle path in a logic circuit, limited a range of synchronous circuits to which the cycle based simulation/static timing verification method, a high-speed logic verification tool, is applicable, and resulted in a problem of prolonging a time for logic verification.

SUMMARY OF THE INVENTION

In view of the above-mentioned point, it is an object of the present invention to provide a logic circuit verification device for a semiconductor integrated circuit capable of reducing a number of events which may occur and capable of achieving high speed verification of a logic circuit without changing connections with the logic circuit.

In order to achieve the above-described object, according to a first aspect of the present invention, there is provided a logic circuit verification device for a semiconductor integrated circuit comprising: a synchronous circuit extracting unit for reading connection information among respective elements of a semiconductor integrated circuit described with a hardware description language and for extracting connection information of a synchronous circuit portion and connection information of a asynchronous circuit portion from the connection information, a circuit information library for registering a pair of connection information of a synchronous circuit portion logically equivalent to the connection information of the asynchronous circuit portion and the connection information of the asynchronous circuit, a logic gate expansion processing unit for converting the connection information of the asynchronous circuit portion extracted by the synchronous circuit extracting unit into the connection information of the synchronous circuit portion paired with the asynchronous circuit portion read from the circuit information library, a cycle based simulation/static timing verification unit which, based on the connection information of the synchronous circuit portion which has been converted by the logic gate expansion processing unit and the connection information of the synchronous circuit portion extracted by the synchronous circuit extracting unit, executes verification of a logic circuit by employing a cycle based simulation method or a static timing verification method with respect to the synchronous circuits corresponding to the two pieces of connection information, and a logic circuit simulation unit for executing verification of a logic circuit using an event-driven system with respect to the connection information of the asynchronous circuit which has not been converted into the connection information of the synchronous circuit by the logic gate expansion processing unit. This logic circuit verification device makes it possible to exhibit an effect of achieving high-speed verification of a logic circuit.

According to a second aspect of the present invention, there is provided a logic circuit verification device for a semiconductor integrated circuit, wherein the logic gate expansion processing unit extracts a clock signal defined in a sensitivity list in the connection information of the asynchronous circuit and converts a logic circuit block of the asynchronous circuit into a logic circuit block of the synchronous circuit, depending on the type of the extracted clock signal from the asynchronous circuit. This makes it possible to exhibit an effect of increasing the number of circuit blocks that can be dealt with as synchronous circuits.

According to a third aspect of the present invention, there is provided a logic circuit verification device for a semiconductor integrated circuit comprising: the synchronous circuit extracting unit for reading the connection information among respective elements of the semiconductor integrated circuit described with the hardware description language and for extracting the connection information of the synchronous circuit portion and the connection information of the asynchronous circuit portion from the connection information, the circuit information library for registering a pair of the connection information of the synchronous circuit portion logically equivalent to the connection information of the asynchronous circuit portion and the connection information of the asynchronous circuit, the logic gate expansion processing unit for converting the connection information of the asynchronous circuit portion extracted by the synchronous circuit extracting unit into the connection information of the synchronous circuit portion paired with the asynchronous circuit portion read from the circuit information library, a delay estimating unit which, based on the connection information of the synchronous circuit portion which has been converted by the logic gate expansion processing unit and the connection information extracted by the synchronous circuit extracting unit, calculates a delay time in a path of the verification circuit and outputs a delay report, a multiple cycle path portion automatic extracting unit for searching a synchronous circuit block of a single cycle path and a synchronous circuit block of a multiple cycle path based on the delay report from the delay estimating unit and a frequency of a clock signal from the outside, a logic simplifying unit which, by deleting circuit elements in the synchronous circuit block which does not influence a logic with respect to the synchronous circuit block of the single cycle path searched by the multiple cycle path portion automatic extracting unit, reduces the number of event changes occurring in a simulation, a cycle based simulation/ static timing verification unit for executing verification of a logic circuit by using a cycle based simulation method or a static timing verification method with respect to the synchronous circuit block in which the number of event changes is reduced by the logic simplifying unit, and the logic circuit simulation unit for executing the verification of the logic circuit by the event-driven system with respect to the connection information of the asynchronous circuit which has not been converted into the connection information of the synchronous circuit by the logic gate expansion processing unit. This makes it possible to exhibit an effect of achieving high-speed verification of the logic circuit.

According to a fourth aspect of the present invention, there is provided a logic circuit verification device for a semiconductor integrated circuit, further comprising a gating unit for imaginarily inserting, on the simulation of verifying the logic circuit, a logic gate for interrupting an input of the clock signal such that circuit elements are not operated when operation of the circuit elements in the synchronous circuit block is not needed with respect to the synchronous circuit block of the multiple cycle path searched by the multiple cycle path portion automatic extracting unit. This makes it possible to reduce the occurrence of events through the deletion of redundant circuit elements, thereby being able to exhibit an effect of achieving high-speed verification of the logic circuit.

BRIEF DESCRIPTION OF THE DRAWINGS

Other objects and advantages of the present invention can be further completely understood by reading the following detailed explanation in reference to attached drawings.

FIG. 2 shows a program used in the first embodiment and describing, using HDL, connection information among respective elements of a semiconductor integrated circuit for verifying the first embodiment;

FIG. 9(2) is a constitutional diagram showing a synchronous circuit where the number of changes of event which may occur in the synchronous circuit in FIG. 9(1) is reduced by a logic simplifying unit of the second embodiment;

FIG. 10(2) is a constitutional diagram showing a synchronous circuit where the number of changes of event which may occur in the synchronous circuit in FIG. 10(1) is reduced by the gating unit of the second embodiment; and FIG. 11 is a flow chart showing operational procedure of the second embodiment.

DETAILED DESCRIPTION OF THE PREFERRED EMBODIMENTS

A detailed explanation will be given concerning preferable embodiments of the present invention in reference to the attached drawings.

First Embodiment

Figure 1:
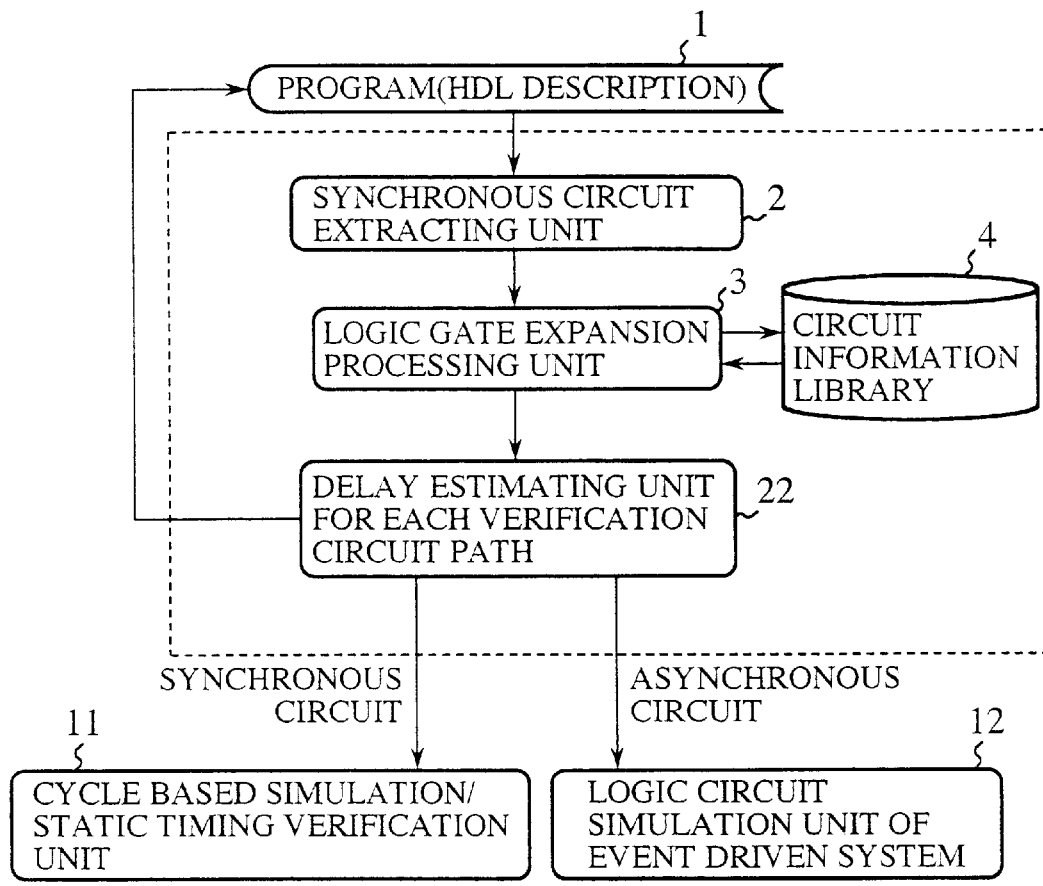
FIG. 1 is a constitutional diagram showing a logic circuit verification device according to a first embodiment of the present invention.

In FIG. 1, numeral 1 designates a program where connection information among respective elements of a semiconductor integrated circuit is described in HDL language and numeral 2 designates a synchronous circuit extracting unit for reading the program 1 and extracting connection information in respect of a synchronous circuit portion of the semiconductor integrated circuit from the program 1. Numeral 3 designates a logic gate expansion processing unit for classifying the connection information of the synchronous circuit portion extracted by the synchronous circuit extracting unit 2 and connection information of a asynchronous circuit portion other than the above-described connection information such that circuit verification can be performed, and for converting the connection information of the asynchronous circuit portion into connection information of the synchronous circuit portion based on circuit conversion information read from a circuit information library 4. The logic gate expansion processing unit outputs the connection information of the synchronous circuit portion extracted from the synchronous circuit extracting unit 2, the connection information of the synchronous circuit portion that has been converted and the connection information of the asynchronous circuit portion that has not been converted into the connection information of the synchronous circuit. Numeral 4 designates the circuit information library registering a pair of the connection information of the synchronous circuit portion logically equivalent to the connection information of the asynchronous circuit portion and the connection information of the asynchronous circuit. Numeral 22 designates a delay estimating unit for calculating a delay time of a combinational circuit portion for each of verification circuit paths based on the connection information of synchronous circuits and asynchronous circuits inputted from the logic gate expansion processing unit 3, for determining whether each of the delay times is within a predetermined delay value for each of the paths, for outputting a delay report for each of the synchronous circuits and the asynchronous circuits and for modifying the program 1 such that when each of the delay times is not within the predetermined delay time for each of the paths, the combination circuit is rearranged into a combinational circuit having a delay time within the predetermined delay time.

Numeral 11 designates a cycle based simulation/static timing verification unit for executing verification of a logic circuit of a semiconductor integrated circuit by the cycle based simulation method or the static timing verification method by checking function of the semiconductor integrated circuit (signal sending and receiving operation among flip-flop circuits according to the example of the first embodiment) based on a change in an event of a clock and by analyzing delay time and timing of a memory element, a combinational circuit or the like of a flip-flop circuit or the like of the semiconductor integrated circuit.

Numeral 12 designates a logic circuit simulation unit of an event-driven system (logic circuit simulation unit) for executing the verification of a logic circuit by inputting delay time, timing and function of a memory element, a combinational circuit or the like such as a flip-flop circuit or the like and by reproducing operation of a total of an actual circuit.

Next, an explanation will be given concerning operational procedure of the synchronous circuit extracting unit 2 in reference to FIG. 2 and FIG. 3.

Figure 3:
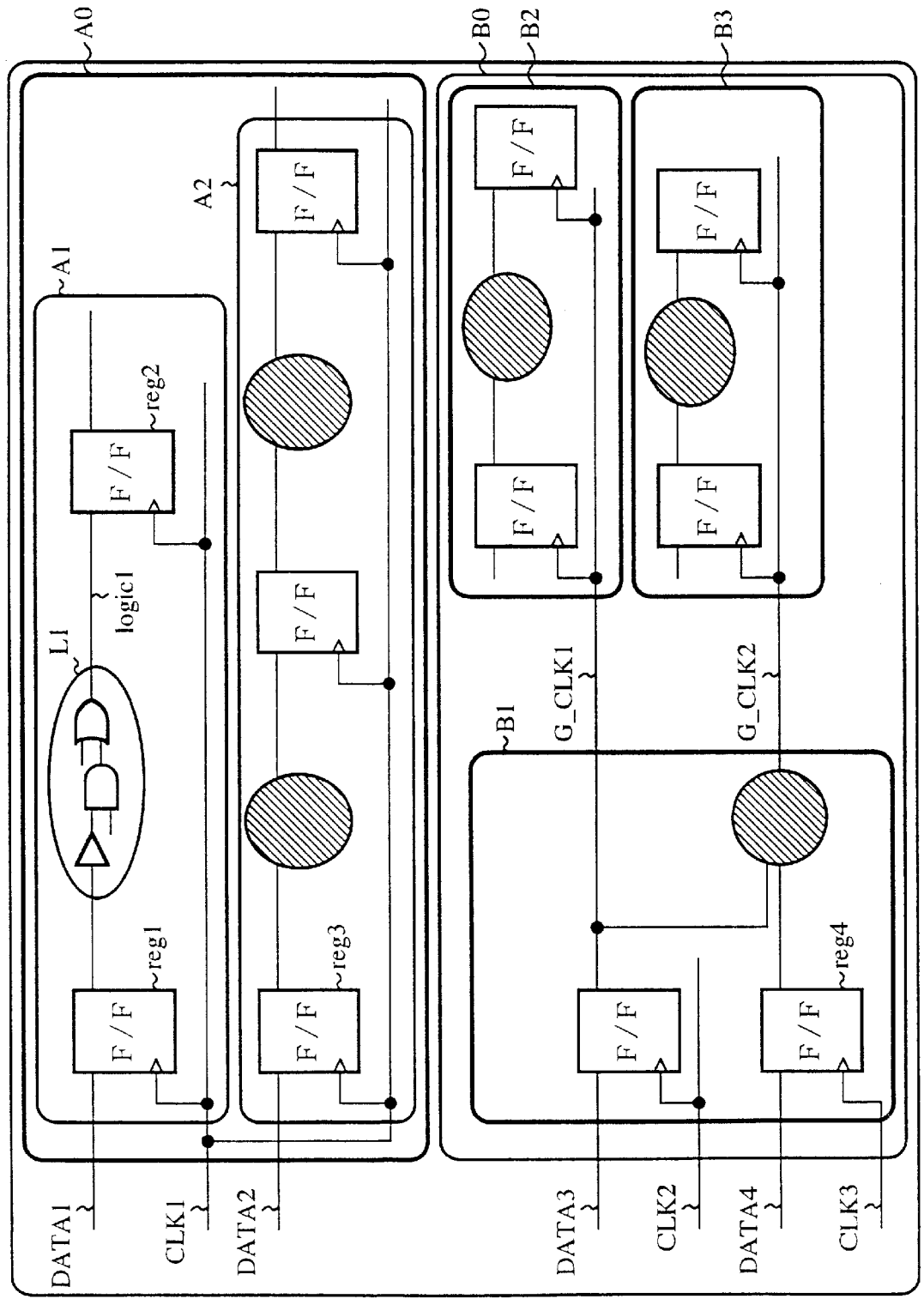
FIG. 3 is a diagram showing information of a logic circuit in correspondence with the program of FIG. 2.

In FIG. 3, notations A0 and B0 designate logic circuit blocks as units of verification each of which exists in a range of object of verification based on simulation from arbitrary input pin to output pin, and the blocks are constituted by a plurality of flip-flop circuits F/F and combinational logic circuit blocks each of which comprises various circuit elements. The logic circuit block A0 is provided with logic circuit blocks A1 and A2 of synchronous circuits at a lower hierarchy and the logic circuit blocks A1 and A2 are operated by one reference clock CLK1 in a range of simulation verification from arbitrary input pin to output pin.

Meanwhile, the logic circuit block B0 is provided with logic circuit blocks B1, B2 and B3 of asynchronous circuits at a lower hierarchy. The logic circuit block B1 is operated by a plurality of reference clocks CLK2 and CLK3 in a range of simulation verification from arbitrary input pin to output pin. The logic circuit blocks B2 and B3 are operated with data signals G_CLK1 and G_CLK2 formed by the logic circuit block B1 as reference clocks. Further, logic circuit blocks operated by divided clocks formed by dividing the reference clocks CLK2 and CLK3 may be provided.

Notations DATA 1, DATA 2, DATA 3, DATA 4 and DATA 5 designate input data signals, notations reg1, reg2, reg3 and reg4 designate values latched by the respective flip-flop circuits F/F, notation logic1 designates an output signal from a combinational logic blocks L1 and hatched portions in the diagram designate logic circuit blocks similar to the logic circuit block L1.

In respect of the program described in HDL shown in FIG. 2, attention is paid to sensitivity lists (signal lists ASL1 and ASL2 successive to "always" in FIG. 2) for extracting connection information of the logic circuit blocks A1 and A2 of the synchronous circuits. First, in the case of the logic circuit blocks A1 and A2, a signal defined in the sensitivity lists ASL1 and ASL2 is only the clock signal CLK1 for operating and controlling the logic circuit blocks A1 and A2. Accordingly, it can be determined that the logic circuit block A0 is a logic circuit block of a synchronous circuit operated with the clock signal CLK1 as one reference clock.

Meanwhile, in the case of the logic circuit block B1 of the asynchronous circuit, signals defined in a sensitivity list BSL1 are two kinds of clock signals CLK2 and CLK3 for operating and controlling the logic circuit block B1. Further, in the case of the logic circuit block B2, a signal defined in a sensitivity list BSL2 is the data signal G_CLK1 for operating and controlling the logic circuit block B2. Further, in the case of the logic circuit block B3, a signal defined in a sensitivity list BSL3 is the data signal G_CLK2 for operating and controlling the logic circuit block B3.

However, when the logic circuit block B1 of the asynchronous circuit is considered similar to the logic circuit block A0, a flip-flop circuit F/F described on the upper side of FIG. 3 is operated only by the clock signal CLK1 and a flip flop circuit F/F and a combinational logic circuit block described on the lower side of FIG. 3 are operated only by the clock CLK3 and therefore, when the respective blocks are regarded as logic circuit blocks at a lower hierarchy of the logic circuit block B1, the logic circuit block B1 can be regarded as being constituted by two logic circuit blocks which are synchronous circuits at a lower hierarchy.

Further, the logic circuit block B2 may be regarded as a logic circuit block of a synchronous circuit in respect of the data signal G_CLK1 and the logic circuit block B3 can be regarded as a logic circuit block of a synchronous circuit in respect of the data signal G_CLK2.

Accordingly, logic circuit blocks of new synchronous circuits can be extracted by further finely dividing the logic circuit blocks B0 and B1 which are asynchronous circuits.

As explained above, by extracting the signals defined in the sensitivity lists and grouping the blocks, five logic circuit blocks of synchronous circuits A0, the two logic circuit blocks at a lower hierarchy of the logic circuit block B1, the logic circuit block B2 and the logic circuit block B3 with the clock signals of CLK1, CLK2, CLK3, G_CLK1 and G_CLK2, can be extracted from the logic circuit blocks which are synchronous circuits or the logic circuit blocks which are asynchronous circuits. In the example of FIG. 3, the synchronous/ asynchronous mixing circuits before grouping can be regarded by grouping as logic circuit blocks all of which are synchronous circuits.

Figure 4:
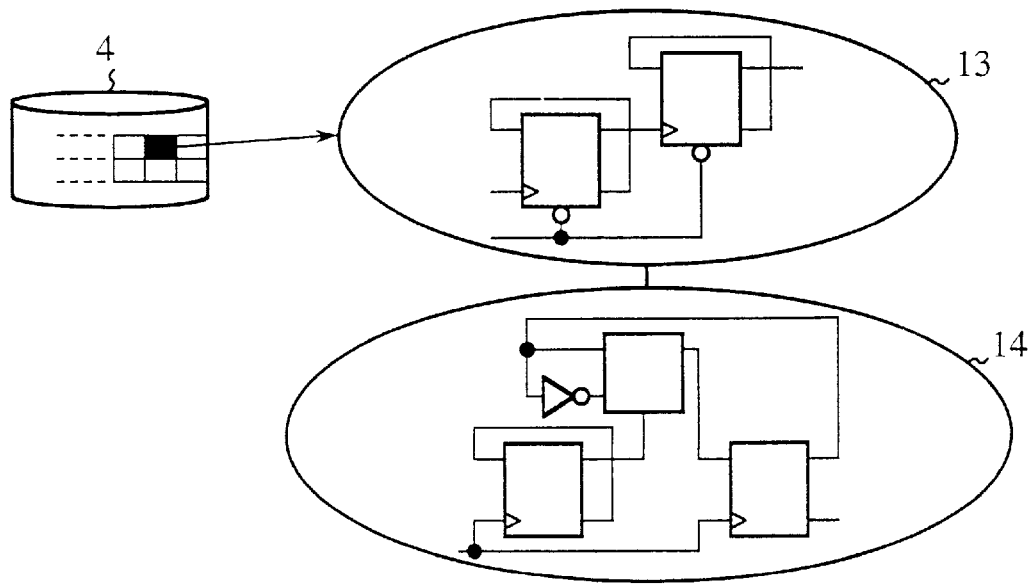
FIG. 4 is a constitutional view showing a concept of the circuit information library used in the first embodiment.

Next, an explanation will be given concerning specific operation of the logic gate expansion-processing unit 3 in reference to FIG. 4.

First, according to the logic gate expansion processing unit 3, in expanding the program 1 described in HDL of a asynchronous circuit 13 inputted from the synchronous circuit extracting unit 2 into logic gates, it is confirmed whether the asynchronous circuit 13 is registered in the circuit information library 4 and when the asynchronous circuit 13 is registered, the asynchronous circuit 13 is replaced by a synchronous circuit 14 logically equivalent to the asynchronous circuit 13. Further, the synchronous circuit logically equivalent to the asynchronous circuit 13 that is newly extracted can be registered to the circuit information library 4 in expanding the program 1 into the logic gates.

Figure 5:
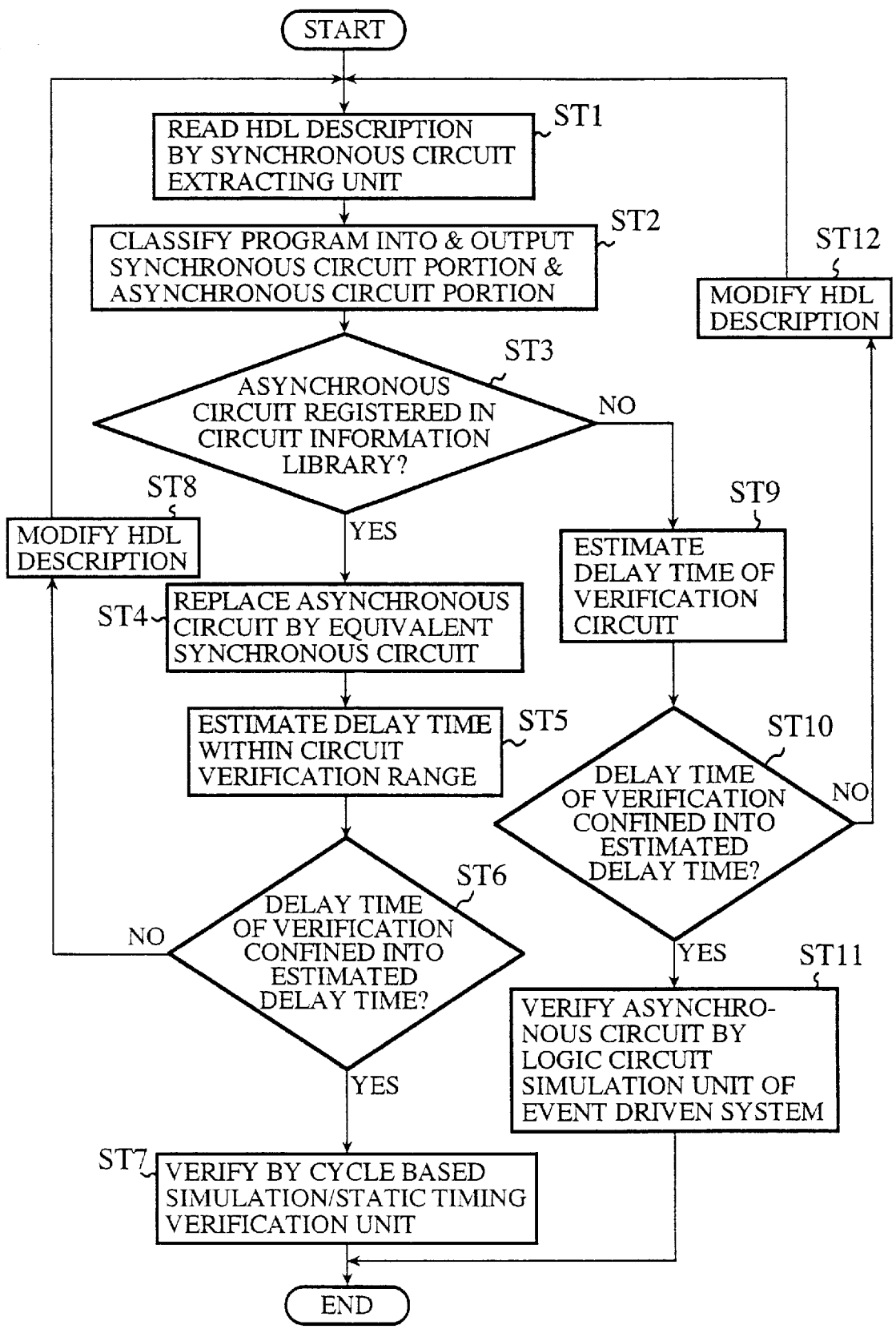
FIG. 5 is a flow chart for explaining operational procedure of the first embodiment.

Next, an explanation will be given concerning total operation of the first embodiment in reference to a flow chart in FIG. 5.

First, the synchronous circuit extracting unit 2 reads the program 1 described in HDL (step ST1), classifies the program 1 into the connection information of the synchronous circuit unit and the connection information of the asynchronous circuit and outputs the classified connection information of the respectives of the synchronous circuit and the asynchronous circuit to the logic gate expansion processing unit 3 (step ST2).

Next, the logic gate expansion processing unit 3 determines whether the asynchronous circuit is registered in the circuit information library 4 in order to convert the connection information of the asynchronous circuit classified by the synchronous circuit extracting unit 2 into connection information of the synchronous circuit (step ST3).

When the asynchronous circuit is registered, the asynchronous circuit is replaced by a synchronous circuit logically equivalent thereto (step ST4) and the delay estimating unit 22 estimates a delay time within a range of circuit verification (step ST5) and determines whether the delay time of the verification circuit is confined into an estimated delay time (step ST6).

When the delay time of the verification circuit is confined into the estimated delay time as the result of the determination at step ST6, the respective connection information of the synchronous circuit inputted from the synchronous circuit extracting unit 2 and the replaced synchronous circuit is outputted and the verification is carried out by the cycle based simulation/static timing verification unit 11 (step ST7).

Meanwhile, when the delay time of the verification circuit is not confined into the estimated delay time, after modifying HDL describing the program 1 (step ST8), the operation returns to step ST1.

Further, when the asynchronous circuit is not registered in the circuit information library 4 as the result of the determination at step ST3, the delay time of the verification circuit is estimated (step ST9) and it is determined whether the delay time of the verification circuit is confined into the estimated delay time (step ST10).

When the delay time of the verification circuit is confined into the estimated delay time as the result of the determination at step ST10, the connection information of the asynchronous circuit is inputted to the logic circuit simulation unit of an event-driven system and the verification is carried out (step ST11).

Meanwhile, when the delay time of the verification circuit is not confined into the estimated delay value, after modifying HDL describing the program 1 (step ST12), the operation returns to step ST1.

As described above, according to the first embodiment, by classifying the program 1 in HDL into the respective connection information of the synchronous circuit portion and the asynchronous circuit portion, by converting a portion of the asynchronous circuit portion into the synchronous circuit portion and by increasing circuit portions the function of which can be verified by using the cycle based simulation/static timing verification unit 11, high speed verification of a logic circuit can be achieved.

Second Embodiment

Figure 6:
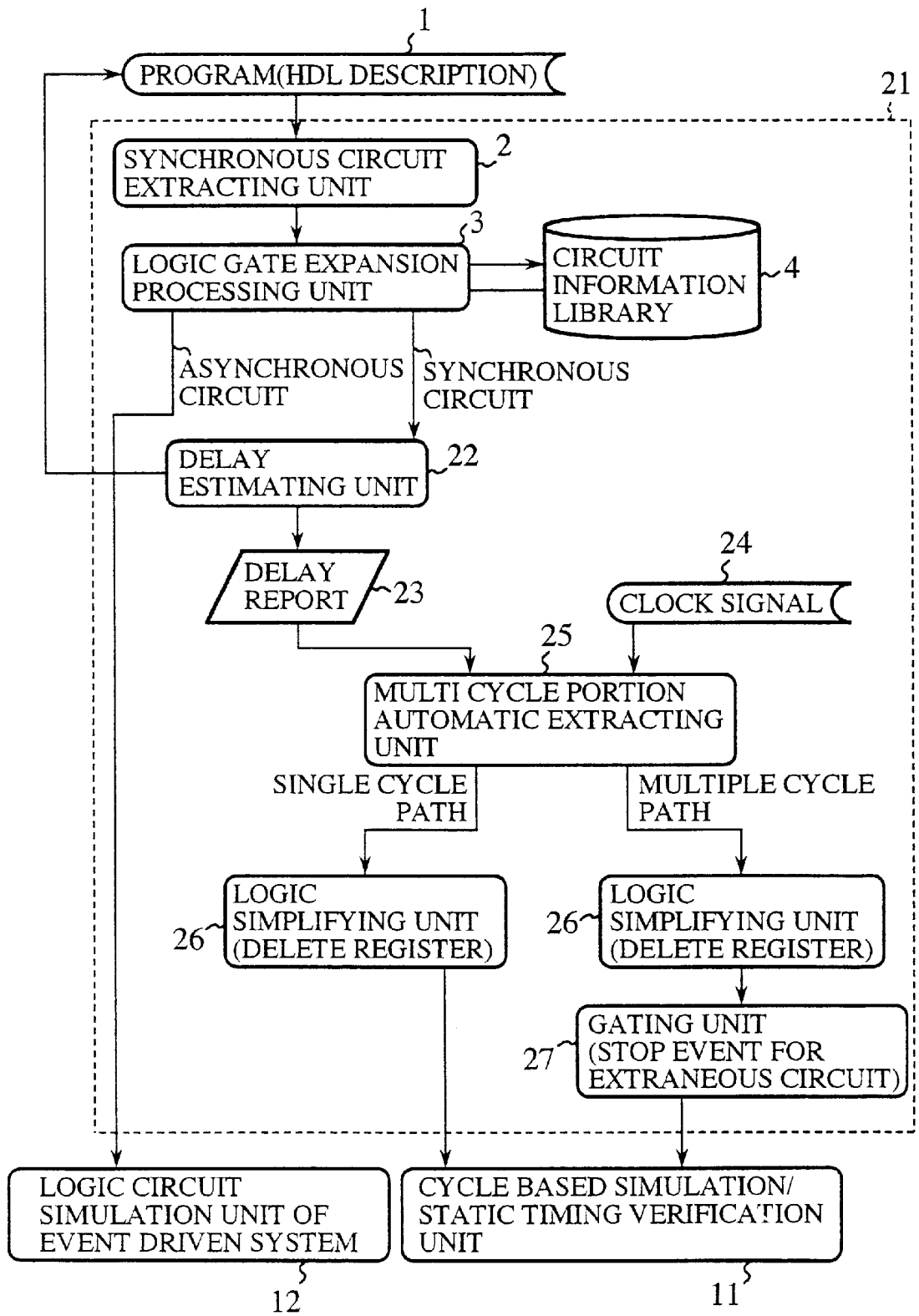
FIG. 6 is a constitutional diagram showing a logic circuit verification device according to a second embodiment of the present invention.

FIG. 6 is a constitutional diagram showing a logic circuit verification device according to a second embodiment in which portions having the same notations in the first embodiment designate the same or the corresponding portions and an explanation thereof will be omitted.

Reference Numeral 21 designates a logic circuit verification device according to the second embodiment of the present invention, numeral 25 designates a multiple cycle path portion automatic extracting unit for searching a synchronous circuit block of a multiple cycle path based on a delay report 23 from a delay estimating unit 22 and a clock signal 24. In respect of the synchronous circuit block of the single cycle path, connection information is outputted to a logic simplifying unit 26 explained below for single cycle to perform processing for the single cycle path. In respect of the synchronous circuit block of the multiple cycle path, connection information is outputted to the logic simplifying unit 26 for multiple cycle path for performing processing for the multiple cycle path.

Numeral 26 designates the logic simplifying unit which, by deleting connection information of a flip-flop circuit which does not influence logic and rearranging a combinational circuit in the midway in respect of the connection information of the synchronous circuit block inputted from the multiple cycle path portion automatic extracting unit 25, reduces the number of times of event changes which may occur in simulation (change of verification pattern in simulation), thus shortening the time for executing the simulation. Two of the logic simplifying units 26 are provided for the single cycle path and for the multiple cycle path.

Numeral 27 designates a gating unit which, in respect of the synchronous circuit block of the multiple cycle path searched by the multiple cycle path portion automatic extracting unit 25, reduces the number of times of event changes which may occur in simulation and shortens the time for executing simulation by imaginarily inserting a logic gate for arbitrarily controlling transmission of a clock signal supplied to a flip-flop circuit at a finish end of a synchronous circuit block which constitutes a multiple cycle path simplified by the logic simplifying unit 26 immediately before the flip-flop circuit at the finish end.

Next, an explanation will be given of concerning specific operation of the delay estimating unit 22 according to the second embodiment in reference to FIG. 7 and FIG. 8.

Figure 7:
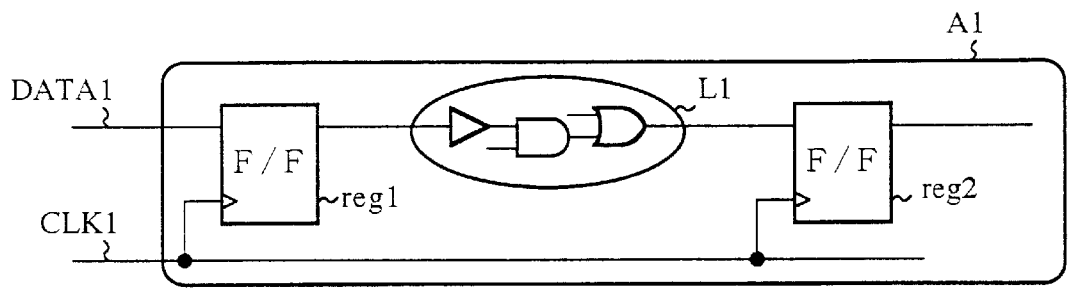
FIG. 7 is a constitutional diagram showing a synchronous circuit portion of a semiconductor integrated circuit by which the verification of the second embodiment is carried out.
Figure 8:
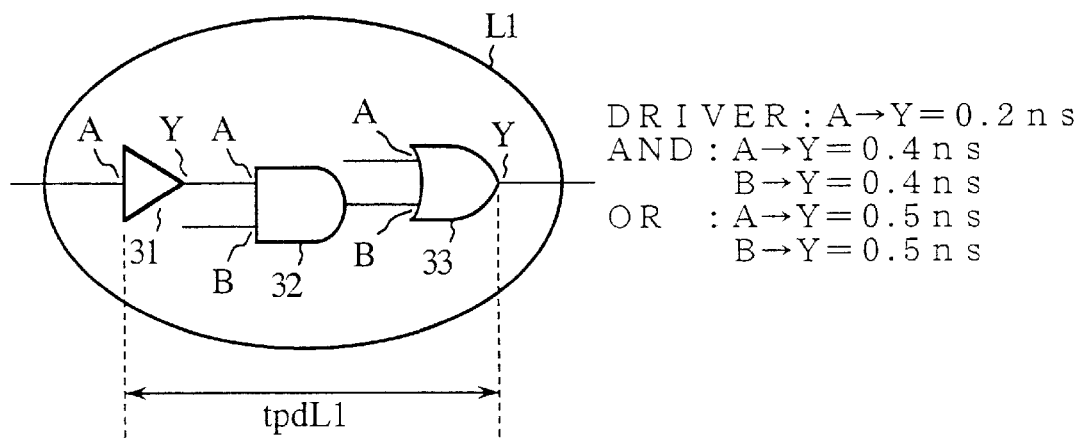
FIG. 8 is a constitutional diagram showing only a combinational circuit portion in the synchronous circuit portion in FIG. 7.

The program 1 described in HDL is expanded by the logic gate expansion processing unit 3, thus obtaining, for example, a logic circuit block A1 constituted by flip-flop circuits F/F and a combinational logic circuit block L1 (constituted by a driver element 31, an AND element 32 and an OR element 33) as shown in FIG. 7 and FIG. 8. When information in respect of the logic circuit block A1 is utilized, a delay time tpdL1 of the combinational logic circuit block L1 can be estimated as driver element 31 (A→Y: 0.2 ns)+AND element 32 (A→Y: 0.4 ns, B→Y: 0.4 ns)+OR element 33 (A→Y: 0.5 ns, B→Y 0.5 ns)=1.1 ns. Further, the estimated delay time tpd L1 is outputted to the multiple cycle path portion automatic extracting unit 25 as the delay report 23.

Conventionally, in performing verification at the cycle based simulation/static timing verification unit 11, the verification is carried out by extracting connection information on the assumption of the synchronous circuit of the single cycle path. However, by estimating the delay time value of the combinational logic circuit block L1 at the delay estimating unit 22, the verification can be performed at the cycle based simulation/static timing verification unit 11 also with respect to the synchronous circuit of the multiple cycle path when the estimated delay time tpdL1 is a delay time which can be verified at the cycle based simulation/static timing verification unit 11.

Next, an explanation will be given concerning the operation of the multiple cycle path portion automatic extracting unit 25.

At the multiple cycle path portion automatic extracting unit 25, a synchronous circuit block that constitutes the multiple cycle path is searched by calculating a number of cycles (number of clocks) necessary for transmitting a signal in a combinational circuit portion from the delay time value of the combinational circuit portion between the respective flip-flop circuits estimated by the delay estimating unit 22 and a frequency of the clock signal 24 provided from the outside. Here, it can be answered by comparing a time of 1 cycle with the delay time of the combinational circuit portion whether the signal at the combinational circuit portion transmits through the multiple cycle path or the single cycle path.

That is, when the delay time of the combinational circuit portion is shorter than the time period of 1 cycle, the signal can transmit through the combinational circuit portion in 1 cycle. However, when the delay time of the combinational circuit portion is longer than the time period of 1 cycle, the signal cannot transmit through the combinational circuit portion in the time period of 1 cycle and such a combinational circuit portion can be regarded as a synchronous circuit block of a multiple cycle path.

Next, an explanation will be given concerning the operation of the logic simplifying unit 26.

Figure 9:
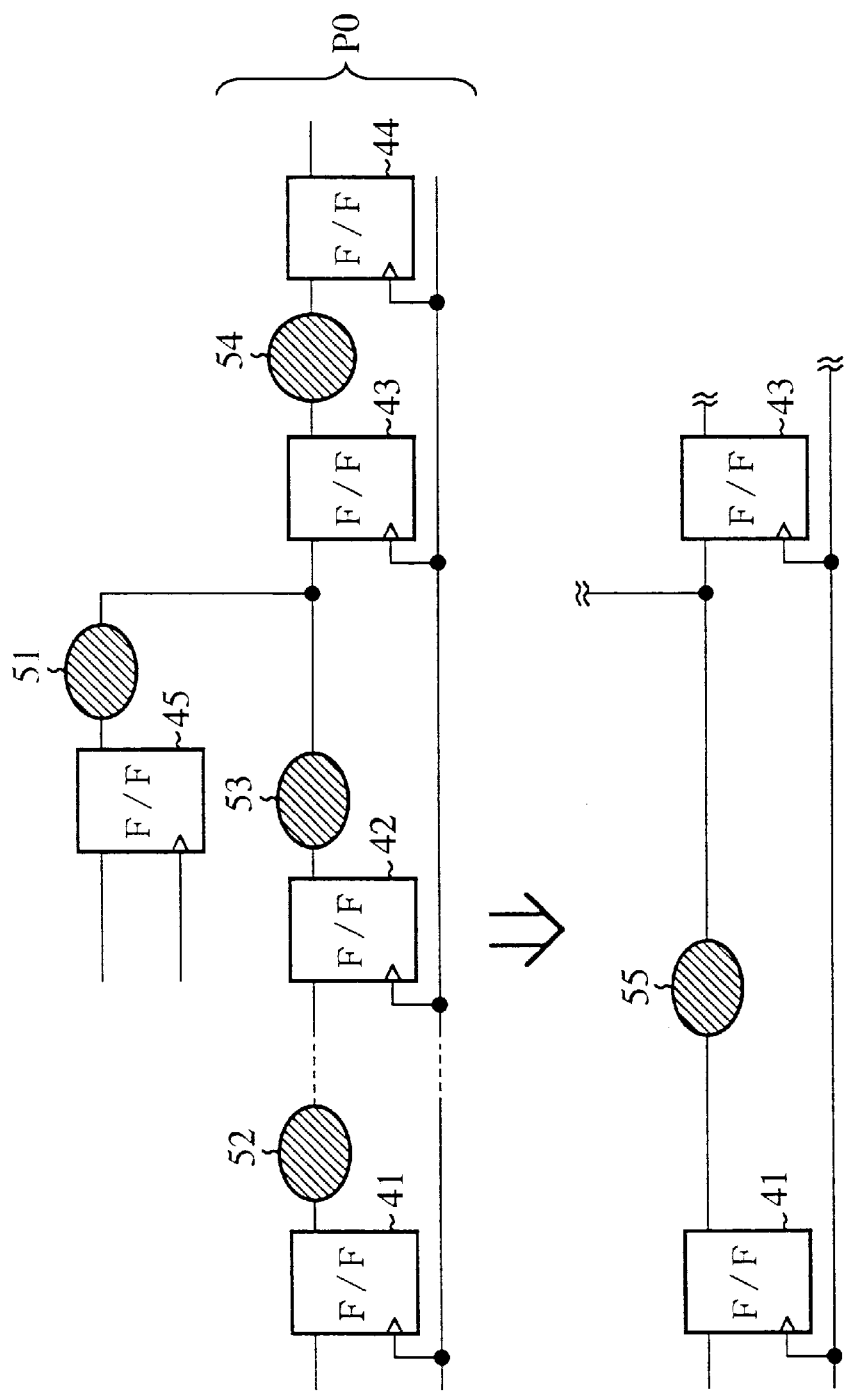
FIG. 9(1) is a constitutional diagram showing a synchronous circuit constituted by 3 or more of flip-flop circuits in the semiconductor integrated circuit by which the verification of the second embodiment is carried out.

FIG. 9(1) designates a synchronous circuit constituted by 3 or more of flip- flop circuits F/F and FIG. 9(2) designates a synchronous circuit where the number of times of event changes which may occur in the synchronous circuit shown in FIG. 9(1) is reduced by the logic simplifying unit 26. In FIG. 9(1) and FIG. 9(2), numerals 41, 42, 43, 44 and 45 designate flip-flop circuits, numerals 51, 52 and 53 designate combinational circuit portions each of which constitutes a single path, numeral 54 designates a combinational circuit portion which constitutes a multiple cycle path and numeral 55 designates an optimized combinational circuit. Hereinafter, an explanation will be given by assuming that a time period of 3 clocks is needed for passing data through the combinational circuit portion 54.

First, in the logic simplifying unit 26, a logic circuit block P0 including the multiple cycle path among the respective synchronous circuit blocks is searched, thus measuring a transmission time period of data transmitting from the initial stage of the flip-flop circuit 41 to the final stage of the flip-flop circuit 44 of the searched logic circuit block P0. Data at the initial stage of the flip flop circuit 41 is inputted to the final stage of the flip flop circuit 44 at a sixth clock pulse since it is assumed that the data transmits through each of the combinational circuit portions 52 and 53 each of which constitutes a single cycle path in a time period of 1 clock signal and 3 clocks are needed for passing the data through the combinational circuit portion 54 which constitutes a multiple circuit path.

However, in respect of a flip-flop circuit having no merge of data except from the logic circuit block P0, even when the flip-flop circuit is excluded from the logic block P0, unless the flip flop circuit is the initial stage of the flip flop circuit 41 or the final stage of the flip flop circuit 44, correct data to be transmitted to the final stage of the flip flop circuit 44 can be obtained so long as only the logic of the combinational circuit is recognized. That is, in respect of the flip flop circuit 42, there is no merge of data except from the logic circuit block P0 and the data of the flip flop circuit 41 is simply received and the data is simply transmitted to the next stage of the flip flop circuit 43. Accordingly, even when the flip flop circuit 42 is excluded from the logic circuit block P0, only the data as an output resulting from the combinational circuit 52 at the preceding stage of the flip flop circuit 42 is transmitted and therefore, correct data is transmitted to the final stage of the flip flop circuit 44. By deleting the flip flop circuit 42, a number of blocks necessary for transmitting the data stored in the flip flop circuit 41 to the flip flop circuit 43 can be reduced by 1 block.

The flip flop circuit 42 is excluded and the combinational circuit 52 and the combinational circuit 53 are rearranged and are converted into a new combinational circuit 55 which has been optimized (where combinational circuits are simplified by replacing circuit elements or a plurality of elements which are not needed for circuit verification with a single element by connecting the combinational circuit 52 with the combinational circuit 53). As described above, according to the logic simplifying unit 26, the flip flop circuit which does not influence the logic (the flip-flop circuit 42 in the example of FIG. 9(1)) is excluded and combinational circuits in the midway are rearranged. This makes it possible to reduce the number of times of event changes which may occur in simulation, thus being able to shorten the time for executing simulation.

Next, an explanation will be given concerning a method of allowing the gating unit 27 to reduce the number of times of event changes which may occur in reference to FIG. 10(1) and FIG. 10(2).

Figure 10:
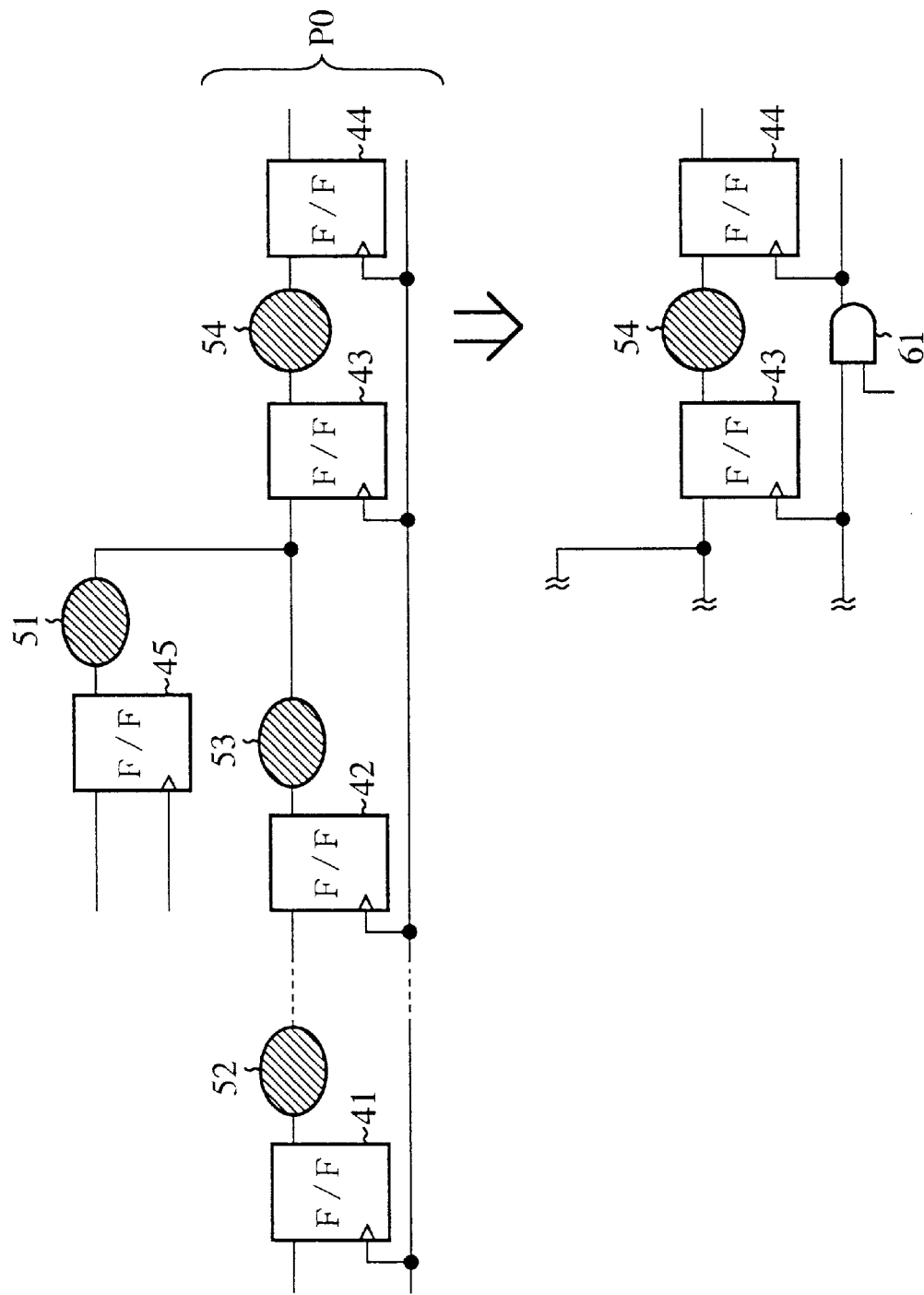
FIG. 10(1) is a constitutional diagram showing a synchronous circuit constituted by 3 or more of flip-flop circuits in the semiconductor integrated circuit by which the verification of the second embodiment is carried out.

FIG. 10(1) is a constitutional diagram showing a logic circuit block quite the same as that shown in FIG. 9(1) and FIG. 10(2) is a circuit diagram in which the logic circuit block P0 shown in FIG. 10(1) is gated by the gating unit 27.

In FIG. 10(2), numeral 61 designates a logic gate for interrupting clock signal input such that the flip flop circuit 44 is not operated while the operation of the flip flop circuit 44 is not needed. Hereinafter, as mentioned above, an explanation will be given by assuming that 3 clock signals are needed for passing the data through the combinational circuit portion 54.

Data which the final stage of the flip flop circuit 44 ultimately needs is the data outputted from the combinational circuit portion 54 after elapse of 3 clock signals and accordingly, the flip flop circuit 44 performs an unnecessary operation during initial 2 clocks until data is transmitted to the flip flop circuit 44. Therefore, if the flip flop circuit 44 is operated when necessary, event changes which may occur in simulation can be reduced. For that purpose, for example, as shown in FIG. 10(2), the logic gate 61 for interrupting clock signal input is imaginarily inserted in simulation such that the flip flop circuit 44 is not operated during a time period where the operation of the flip flop circuit 44 is not needed. That is, although the logic gate 61 is not actually inserted, the simulation is performed by assuming that the logic gate 61 were inserted and during a time period where the logic gate 61 interrupts input of clock signal, event change in respect of the flip flop circuit 44 is prevented from occurring and the number of times of event changes which may occur in simulation is reduced. This makes it possible to dispense with an unnecessary time required in simulation accompanied by an occurrence of the unnecessary event, thereby shortening the time for executing simulation. Further, gating is performed by the logic gate 61 to reduce event change, so that the multiple cycle path can pseudonymously be used even in the cycle based simulation/static timing verification method which cannot deal with the multiple cycle path.

Next, an explanation will be given concerning the total operation of the second embodiment in reference to a flow chart in FIG. 11. Incidentally, in the flow chart in FIG. 11, a step having the same content as that in the flow chart in FIG. 5 is attached to the same step number and an explanation thereof will be omitted.

When the delay time of a verification circuit estimated at the delay estimating unit 22 is confined in an estimated delay time, the synchronous circuit block of the multiple cycle path is searched based on the delay report 23 and the frequency of the clock signal 24 (step ST 21). Next, it is determined whether the searched synchronous circuit block constitutes the synchronous circuit block of the single cycle path or the synchronous circuit block of the multiple cycle path. (step ST 22). When the searched synchronous circuit block does not constitute the synchronous circuit block of the multiple cycle path but the synchronous circuit block of the single cycle path, the logic simplifying unit 26 excludes flip-flop circuits which do not influence the logic and rearranges combinational circuits in the midway, thus making it possible to reduce the number of times of event changes which may occur in simulation (step ST 23). Thereafter, the verification is carried out by using the cycle based simulation/static timing verification unit 11 (step ST7).

When the searched synchronous circuit block constitutes the synchronous circuit block of the multiple cycle path as the result of determination at step ST 22, the logic simplifying unit 26 excludes flip-flop circuits which does not influence the logic and rearranges combinational circuits in the midway, thereby making it possible to reduce the number of times of event changes which may occur in simulation (step ST 24). Next, the gating unit 27 imaginarily inserts the logic gate 61 for interrupting clock signal input such that the flip flop circuit 44 is not operated during a time period where the operation of the flip flop circuit 44 is not needed (step ST 25) and event change in respect of the flip flop circuit 44 is not needed. This makes it possible to reduce the total number of times of event changes that may occur in simulation, thus shortening the time for executing the simulation.

As described above, according to the second embodiment, higher speed verification of a logic circuit can be achieved compared with the first embodiment by deleting redundant flip-flop circuits and by deleting events, and a multiple cycle path can pseudonymously be verified by using the cycle based simulation/static timing verification method.

Although as mentioned above the explanation has been given concerning preferable embodiments of the present invention, the explanation is exemplary and it should be understood that modification or change from the explanation can be performed without deviating from the spirit and scope of the following claims.

What is claimed is:

1. A logic circuit verification device for a semiconductor integrated circuit, comprising:

a synchronous circuit extracting unit for reading connection information among respective elements of the semiconductor integrated circuit described in a hardware description language and for extracting connection information of a synchronous circuit portion and connection information of a asynchronous circuit portion from said connection information;

a circuit information library for registering a pair of the connection information of the synchronous circuit portion and the connection information of the asynchronous circuit portion;

said connection information of the synchronous circuit portion being logically equivalent to the connection information of the asynchronous circuit portion, a logic gate expansion processing unit for converting the connection information of the asynchronous circuit portion extracted by said synchronous circuit extracting unit into the connection information of the synchronous circuit portion read from said circuit information library and paired with said connection information of the asynchronous circuit portion;

a cycle based simulation/static timing verification unit which, based on the connection information of the synchronous circuit portion which has been converted by said logic gate expansion processing unit and the connection information of the synchronous circuit portion extracted by said synchronous circuit extracting unit, executes verification of a logic circuit through a cycle based simulation method or a static timing verification method with respect to the synchronous circuits corresponding to said two pieces of the connection information; and a logic circuit simulation unit for executing verification of a logic circuit in accordance with an event-driven system with respect to the connection information of the asynchronous circuit which has not been converted into the connection information of the synchronous circuit by said logic gate expansion processing unit.

2. A logic circuit verification device for a semiconductor integrated circuit as claimed in claim 1, wherein said logic gate expansion processing unit extracts a clock signal defined in a sensitivity list in the connection information of said asynchronous circuit and, based on the type of the extracted clock signal of the asynchronous circuit, converts a logic circuit block of said asynchronous circuit into a logic circuit block of the synchronous circuit.

3. A logic circuit verification device for a semiconductor integrated circuit, comprising:

a synchronous circuit extracting unit for reading connection information among respective elements of the semiconductor integrated circuit described in a hardware description language and for extracting connection information of a synchronous circuit portion and connection information of a asynchronous circuit portion from said connection information;

a circuit information library for registering a pair of the connection information of the synchronous circuit portion and the connection information of the asynchronous circuit portion;

said connection information of the synchronous circuit portion being logically equivalent to the connection information of the asynchronous circuit portion, a logic gate expansion processing unit for converting the connection information of the asynchronous circuit portion extracted by said synchronous circuit extracting unit into the connection information of the synchronous circuit portion read from said circuit information library and paired with said connection information of the asynchronous circuit portion;

a delay estimating unit which, based on the connection information of the synchronous circuit portion which has been converted by said logic gate expansion processing unit and the connection information extracted by said synchronous circuit extracting unit, calculates a delay time in a path of a verification circuit and outputs a delay report;

a multiple cycle path portion automatic extracting unit which, based on the delay report from said delay estimating unit and a frequency of a clock signal from the outside, searches a synchronous circuit block of a single cycle path and a synchronous circuit block of a multiple cycle path;

a logic simplifying unit for reducing the number of times that event changes occur during a simulation by deleting circuit elements in the synchronous circuit block which do not influence a logic with respect to the synchronous circuit block of the single cycle path searched by said multiple cycle path portion automatic extracting unit;

a cycle based simulation/static timing verification unit for executing verification of a logic circuit through a cycle based simulation method or a static timing verification method with respect to the synchronous circuit block in which said logic simplifying unit reduces the number of times that the event changes occur; and a logic circuit simulation unit for executing verification of a logic circuit in accordance with an event-driven system with respect to the connection information of the asynchronous circuit which has not been converted into the connection information of the synchronous circuit by said logic gate expansion processing unit.

4. A logic circuit verification device for a semiconductor integrated circuit as claimed in claim 3, wherein said circuit elements are flip-flop circuits.

5. A logic circuit verification device for a semiconductor integrated circuit as claimed in claim 3, further comprising:

a gating unit for imaginarily inserting on the simulation of verifying the logic circuit, a logic gate for interrupting an input of the clock signal so that said circuit elements do not operate when the circuit elements in the synchronous circuit block need not operate with respect to the synchronous circuit block of the multiple cycle path searched by said multiple cycle path portion automatic extracting unit.

6. A logic circuit verification device for a semiconductor integrated circuit as claimed in claim 5, wherein said circuit elements are flip-flop circuits.

* * * * *